US006566180B2

(12) United States Patent
Park et al.

(10) Patent No.: US 6,566,180 B2
(45) Date of Patent: May 20, 2003

(54) THIN FILM TRANSISTOR AND FABRICATION METHOD THEREOF

(75) Inventors: Kee-Chan Park, Kyonggi-do (KR); Juhn-Suk Yoo, Seoul (KR); Min-Koo Han, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/133,314

(22) Filed: Apr. 29, 2002

(65) Prior Publication Data

US 2002/0113236 A1 Aug. 22, 2002

Related U.S. Application Data

(62) Division of application No. 09/893,655, filed on Jun. 29, 2001, now Pat. No. 6,455,874.

(30) Foreign Application Priority Data

Sep. 9, 2000 (KR) ........................................ 2000-53837

(51) Int. Cl.[7] ........................ H01L 21/84; H01L 21/00
(52) U.S. Cl. ...................... 438/166; 438/486; 438/487; 438/163
(58) Field of Search ............................... 438/166, 486, 438/487, 163, 164, 586, 595, FOR 200, FOR 269, FOR 478, 30, 152

(56) References Cited

U.S. PATENT DOCUMENTS

| 5,952,690 A | * | 9/1999 | Kim ........................... 257/316 |
| 2001/0001745 A1 | * | 5/2001 | Im et al. ..................... 438/747 |
| 2001/0029074 A1 | * | 10/2001 | Tsukamoto ................. 438/199 |
| 2002/0192882 A1 | * | 12/2002 | Okumura ..................... 438/149 |

FOREIGN PATENT DOCUMENTS

| JP | 04085923 A | * | 3/1992 | ........... H01L/21/20 |
| JP | 11297852 A | * | 10/1999 | ....... H01L/21/8238 |

* cited by examiner

Primary Examiner—George Fourson
Assistant Examiner—Thanh V Pham
(74) Attorney, Agent, or Firm—Birch, Stewart, Kolasch & Birch, LLP

(57) ABSTRACT

The present invention discloses a thin film transistor (TFT) and fabrication method thereof for a liquid crystal display device. The thin film transistor includes a substrate; a buffer layer on the substrate; an amorphous silicon layer having a pure amorphous silicon area and doped amorphous silicon areas, the pure amorphous silicon area having vertical offsets in both sides thereof, the doped amorphous silicon areas having source and drain areas, the doped amorphous silicon areas being doped by a dopant, the source and drain areas positioned on both sides of the pure amorphous silicon area and etched to expose the vertical offsets; an oxidized layer on the pure amorphous silicon area; a polycrystalline silicon layer on the oxidized layer; a gate insulating layer on the polycrystalline silicon layer; a gate electrode on the gate insulating layer; an inter layer insulator having first and second contact holes, the inter layer insulator covering the amorphous silicon layer, the oxidized layer, the polycrystalline silicon layer, the gate insulating layer, and the gate electrode; and source and drain electrodes contacting the source areas through the first contact hole and the drain area through the second contact hole, respectively.

12 Claims, 18 Drawing Sheets

THIN FILM TRANSISTOR AND FABRICATION METHOD THEREOF

CROSS REFERENCE

This application is a divisional of application Ser. No. 09/893,655, filed on Jun. 29, 2001, now U.S. Pat. No. 6,455,874, the entire contents of which are hereby incorporated by reference and for which priority is claimed under 35 U.S.C. §120; and this application claims priority of Application No. 2000-53837 filed in Korea on Sep. 9, 2000, under 35 U.S.C. §119.

BACKGROUND OF THE INVENTION

1. Field of the Invention

This present invention relates to a thin film transistor (TFT), and more particularly, to a thin film transistor for an LCD device and a fabrication method thereof.

2. Description of the Related Art

In general, liquid crystal display (LCD) devices make use of optical anisotropy and polarization properties of liquid crystal molecules to control arrangement orientation. The arrangement direction of the liquid crystal molecules can be controlled by an applied electric field. Accordingly, when an electric field is applied to liquid crystal molecules, the arrangement of the liquid crystal molecules changes. Since refraction of incident light is determined by the arrangement of the liquid crystal molecules, display of image data can be controlled by changing the electric field applied to the liquid crystal molecules.

Of the different types of known LCDs, active matrix LCDs (AM-LCDs), which have thin film transistors and pixel electrodes arranged in a matrix form, are the subject of significant research and development because of their high resolution and superiority in displaying moving images.

FIG. 1 shows a typical LCD device. The LCD device 11 includes an upper substrate 5 and a lower substrate 22 with a liquid crystal layer 14 interposed therebetween. The upper substrate 5 and the lower substrate 22 are commonly referred to as a color filter substrate and an array substrate, respectively.

In the upper substrate 5 and upon the surface opposing the lower substrate 22, a black matrix 6 and a color filter layer 7 are formed in the shape of an array matrix and includes a plurality of red (R), green (G), and blue (B) color filters so that each color filter is surrounded by corresponding portions of the black matrix 6. Additionally, a common electrode 18 is formed on the upper substrate 5 that covers the color filter layer 7 and the black matrix 6. In the lower substrate 22 and upon the surface opposing the upper substrate 5, a thin film transistor (TFT) "T" is formed in the shape of an array matrix that corresponds to the color filter layer 7. A plurality of crossing gate lines 13 and data lines 15 are positioned such that each TFT "T" is located near each crossover point of the gate lines 13 and the data lines 15.

Furthermore, a plurality of pixel electrodes 17 are formed on a pixel region "P" that is defined by the gate lines 13 and the data lines 15 of the lower substrate 22. Each of the pixel electrodes 17 includes a transparent conductive material having good transmissivity such as indium-tin-oxide (ITO) or indium-zinc-oxide (IZO), for example.

According to the LCD device 11 of FIG. 1, a scanning signal is applied to a gate electrode of the TFT "T" through the gate line 13, while a data signal is applied to a source electrode of the TFT "T" through the data line 15. As a result, the liquid crystal molecules of the liquid crystal layer 14 are aligned and arranged by operation of the TFT "T", and incident light passing through the liquid crystal layer 14 is controlled to display an image.

Within the configuration of the array substrate in the above-mentioned LCD device, an active channel is the most important part in the switching device (i.e., thin film transistor) operation. This active channel of the thin film transistor is usually made of polycrystalline silicon (poly-Si) or amorphous silicon (a-Si: H) having hydrogen.

Generally, the amorphous silicon (a-Si) is deposited on a glass substrate by thickness of 500 angstroms (Å) using PECVD (plasma-enhanced chemical vapor deposition) or LPCVD (low pressure chemical vapor deposition). However, since the active channel constituted by this amorphous silicon is unstable compared to the polycrystalline silicon (poly-Si), a dangling bond occurs in a surface of the active channel. The dangling bond traps carrier electrons such that this dangling bond impedes the flow of carrier electons in the active channel, thus reducing conductivity. Accordingly, electron mobility in the amorphous silicon active channel is much less than that in the active channel constituted by the polycrystalline silicon. Namely, if the electron mobility of the active channel constituted by the amorphous silicon is 1 $cm^2/Vs$, the electron mobility of the active channel constituted by the polycrystalline silicon is scores to hundreds $cm^2/Vs$. Further, the electron mobility of a thin film transistor (TFT) employing the polycrystalline silicon as the active channel depends on the grain size of the polycrystalline silicon, defects existing in the grain boundary and interface defects between a gate insulating layer and a silicon layer. Namely, the larger the grain size; the larger the electron mobility. Also, the fewer defects that exist in the grain boundary and interface between the gate insulating layer and the silicon layer, the larger the electron mobility.

However, the poly-Si TFT has large OFF current because of a large electron mobility. The major reason for this phenomenon is that the leakage current increases in the border between doped and un-doped areas of the poly-Si. On the contrary, the amorphous silicon (a-Si) has smaller OFF current than the polycrystalline silicon (poly-Si).

Therefore, in a large-sized liquid crystal panel, the poly-Si element is generally arranged in the outer part of the liquid crystal panel and used as a driving device, while the a-Si element is used as a switching device. These uses are because the driving device needs high electron mobility and the switching device needs low OFF current in order to not affect the images of the liquid crystal panel. However, the switching device advisably needs both low OFF current and high electron mobility.

FIGS. 2A to 2E are cross-sectional views illustrating a fabrication process for a polycrystalline silicon (poly-Si) thin film transistor (TFT) using a conventional laser crystallization method.

Referring to FIG. 2A, a buffer layer 2 is formed on a substrate 22, and then an amorphous silicon (a-Si) layer 4 is deposited on the buffer layer 2. The buffer layer 2 is made of an insulating material and serves to prevent an alkali material from extracting from the substrate 22. After forming the amorphous silicon (a-Si), the crystallization process crystallizing the amorphous silicon layer 4 is performed using a laser beam. Thus, the a-Si is changed into poly-Si.

Thereafter, the polycrystalline silicon (poly-Si), as shown in FIG. 2B, is then patterned so as to form an active layer 9 in an island shape on the buffer layer 2.

Now, referring to FIG. 2C, a gate insulating layer 10 and a gate electrode 12 are formed on the island-shaped active layer 9. In order to reduce the mask processes, the gate insulating layer 10 and gate electrode 12 are simultaneously formed using the same mask. Since, the gate insulating layer 10 and the gate electrode 12 are disposed in the central portion of the active layer 9, the active layer 9 is divided into three areas, i.e., a first active area 16, a second active area 21 and a third active area 23. Accordingly, the gate insulation layer 10 and gate electrode 12 are on and over the second active area 21. The first and third active areas 16 and 23 are disposed on both sides of the active layer 9.

Thereafter, the active layer 9 is introduced by $n^+$(or $p^+$) ion doping (plasma doping) using the gate electrode 12 as a mask. At this time, the gate electrode 12 acts as an ion-stopper that prevents the dopant ($n^+$ or $p^+$ ion) from penetrating into the second active area 21. Therefore, the second active area 21 remains as a pure silicon area, while the first and third active areas 16 and 23 doped by the dopant become impure silicon areas.

During the ion doping process, the electrical characteristics of the active layer 9 change depending on the dopant. If the dopant is a Group IIIA element gas such as $B_2H_6$, the first and third active areas 16 and 23 become p-type semiconductor. Further, if the dopant is a Group VA element gas such as $PH_3$, the first and third active areas 16 and 23 become n-type semiconductor. The dopant gases can be selected in accordance with the semiconductor type desired.

Now, referring to FIG. 2D, an interlayer insulator 25 is formed to cover the buffer layer 2, the first and third active areas 16 and 23, the gate insulating layer 10 and the gate electrode 12. Thereafter, first and second contact holes 17 and 24 are formed by patterning the inter layer insulator 25. The first and second contact holes 17 and 24 respectively expose portions of the first and third active areas 16 and 23.

Referring to FIG. 2E, source and drain electrodes 25 and 27 are formed by depositing and patterning a metallic material. The source electrode 25 contacts the first active area 16 through the first contact hole 17, while the drain electrode 27 contacts the third active area 23 through the second contact hole 24. After that, a passivation layer 26 is formed over the entire surface of the substrate 22. Then, a drain contact hole 29 to the drain electrode 27 is formed by patterning the passivation layer 26. Thus, the drain contact hole 29 exposes a portion of the drain electrode 27. Thereafter, a transparent conductive material is deposited on the passivation layer 26 and then patterned to form a pixel electrode 30 that contacts the drain electrode 27 through the drain contact hole 29. Accordingly, the poly-Si TFT is complete.

As mentioned above, the poly-Si TFT is fabricated using a conventional laser crystallization method such that the top gate coplanar type poly-Si TFT is fabricated. Namely, the TFT is a top-gate type.

When fabricating a TFT using poly-Si, the degradation of the electrical characteristics of the TFT still remains as one of the critical problems to be solved. In an area "A" near the drain junction, i.e., in a drain depletion region, the electron-hole pair generation easily occurs due to the trapped carriers existing in the grain and in the grain boundary of the poly-Si.

Accordingly, the display quality of the liquid crystal panel is deteriorated due to the large leakage current flow. Further, when driving the devices for a long time, the electrical characteristics of the elements is degraded. Namely, the atomic bond of silicon is broken or the dangling bond of silicon combining hydrogen (H) is broken. During the laser crystallization process, the laser beam cannot uniformly irradiate the substrate. If the laser beam irradiates the silicon layer more strongly, the thickness of the crystallized silicon is thicker. On the contrary, if the laser beam irradiates the amorphous silicon layer more lightly, the thickness of the crystallized silicon is thinner. Therefore, the characteristics of the TFT varies depending on whether the TFT is formed on the largely crystallized silicon or on the slightly crystallized silicon, thereby causing deterioration of the display device.

SUMMARY OF THE INVENTION

To overcome the problems described above, embodiments of the present invention provide a thin film transistor (and method of making the same) for use in a liquid crystal display device, which has a structure that provides high electron mobility, low OFF current, improved stability for a long time and uniform crystallization throughout a substrate.

The present invention, in part, provides a thin film transistor for use in a liquid crystal display device, the thin film transistor including: a substrate; a buffer layer on the substrate; a amorphous silicon layer having a pure amorphous silicon area and doped amorphous silicon areas, the pure amorphous silicon area having vertical offsets in both sides thereof, the doped amorphous silicon areas having source and drain areas, the doped amorphous silicon areas doped by a dopant, the source and drain areas positioned on both sides of the pure amorphous silicon area and etched to expose the vertical offsets; an oxidized layer on the pure amorphous silicon area; a polycrystalline silicon layer on the oxidized layer; a gate insulating layer on the polycrystalline silicon layer; a gate electrode on the gate insulating layer; an inter layer insulator having first and second contact holes, the inter layer insulator covering the amorphous silicon layer, the oxidized layer, the polycrystalline silicon layer, the gate insulating layer, and the gate electrode; and source and drain electrodes contacting the source areas through the first contact hole and the drain area through the second contact hole, respectively.

The amorphous silicon layer has a thickness of 3800–4200 angstroms (Å), and the oxidized layer has a thickness of 10–20 angstroms (Å). The oxidized layer is formed by dipping the substrate having the amorphous silicon layer into the solution that includes concentrated sulfuric acid and oxygenated water. The dopant is $n^+$ or $p^+$ ions.

The polycrystalline silicon layer has a thickness of 350–450 angstroms (Å) and is formed by crystallizing the amorphous silicon using an excimer laser that has an energy level in a range of 220–270 mJ/cm$^2$.

The present invention, also in part, provides methods of fabricating such thin film transistor for use in a liquid crystal display device. The methods include: forming a buffer layer on a substrate; forming a first amorphous silicon layer on the buffer layer; forming an oxidized layer on the amorphous silicon layer; forming a second amorphous silicon layer on the oxidized layer; crystallizing the second amorphous silicon layer to form a polycrystalline silicon layer; forming a gate insulating layer on the polycrystalline silicon layer; forming a gate electrode on the gate insulating layer; forming island-shaped gate electrode, gate insulating layer, polycrystalline silicon layer, and oxidized layer so as to expose the first amorphous silicon layer; forming source and drain areas by doping a dopant into the exposed first amorphous silicon layer using the island-shaped gate electrode as an ion stopper; forming an inter layer insulator having first and second contact holes, the inter layer insulator covering the amorphous silicon layer, the oxidized layer, the polycrystalline silicon layer, the gate insulating layer, and the gate electrode; and forming source and drain electrodes contacting the source areas through the first contact hole and the drain area through the second contact hole, respectively.

The first amorphous silicon layer has a thickness of 3800–4200 angstroms (Å), and the oxidized layer has a thickness of 10–20 angstroms (Å).

Forming the oxidized layer comprises dipping the substrate having the amorphous silicon layer into the solution that includes concentrated sulfuric acid and oxygenated water.

The dopant is $n^+$ or $p^+$ ions. The polycrystalline silicon layer has a thickness of 350–450 angstroms (Å).

Crystallizing the second amorphous silicon layer uses an excimer laser that has an energy level in a range of 220–270 mJ/cm$^2$.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Reference will now be made in detail to the preferred embodiment of the present invention, an example of which is illustrated in the accompanying drawings. Wherever possible, the same reference numbers will be used throughout the drawings to refer to the same or the like part.

FIGS. 3A to 3G are cross-sectional views illustrating a process for fabricating a polycrystalline silicon (poly-Si)/amorphous silicon (a-Si) double layer thin film transistor (TFT) according to the present invention.

Figure 1:
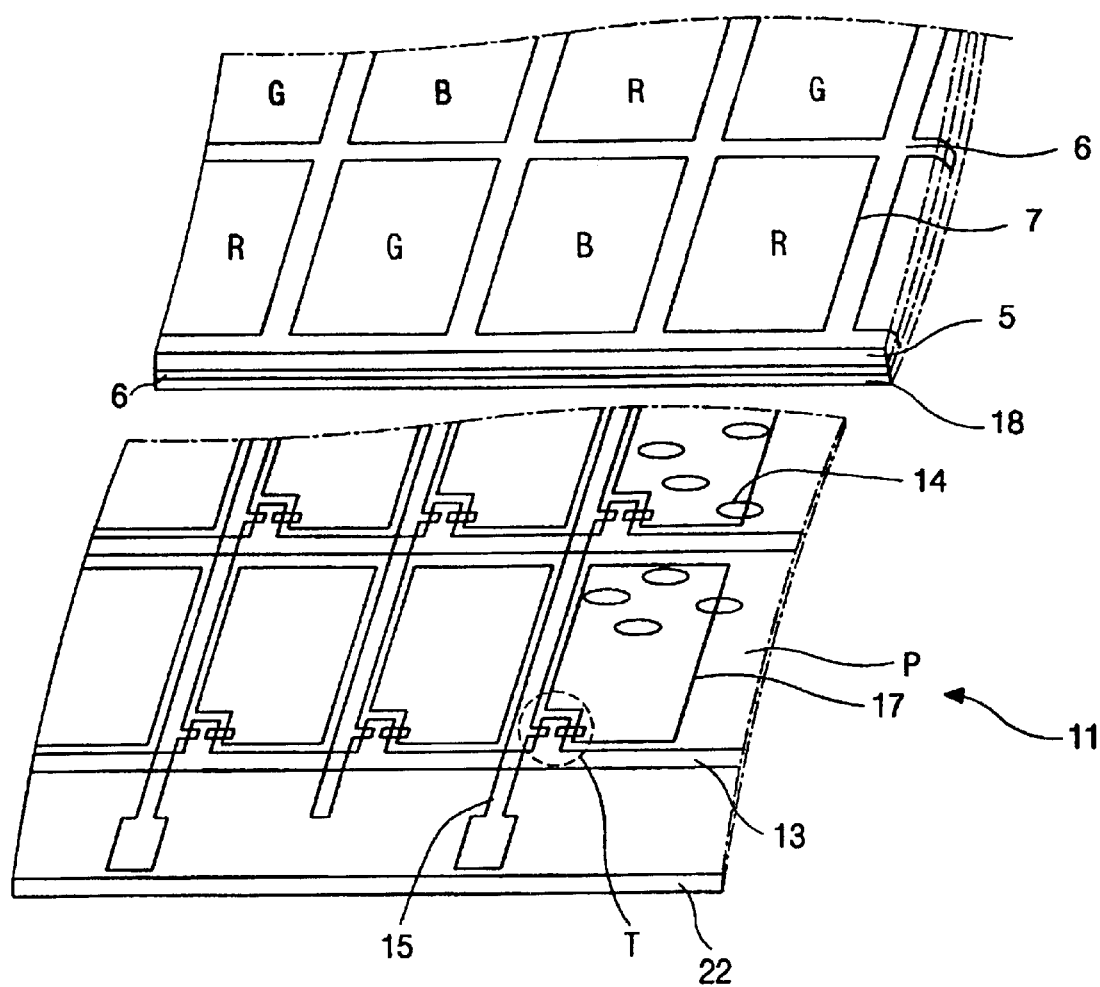
FIG. 1 shows a related art LCD device.
Figure 2A:
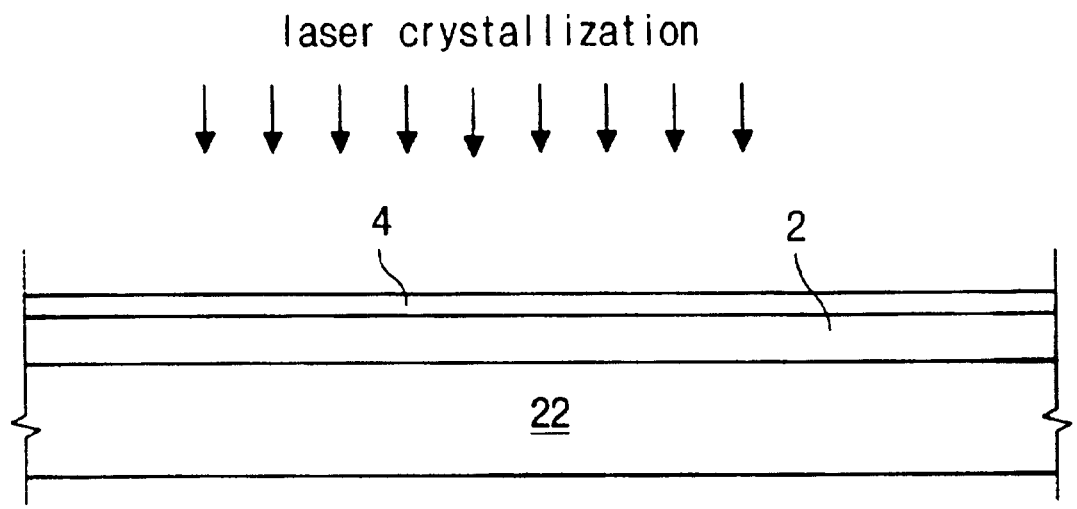
FIGS. 2A to 2E are cross-sectional views illustrating a fabrication process for making a polycrystalline silicon (poly-Si) thin film transistor (TFT) using a conventional laser crystallization method.
Figure 2B:
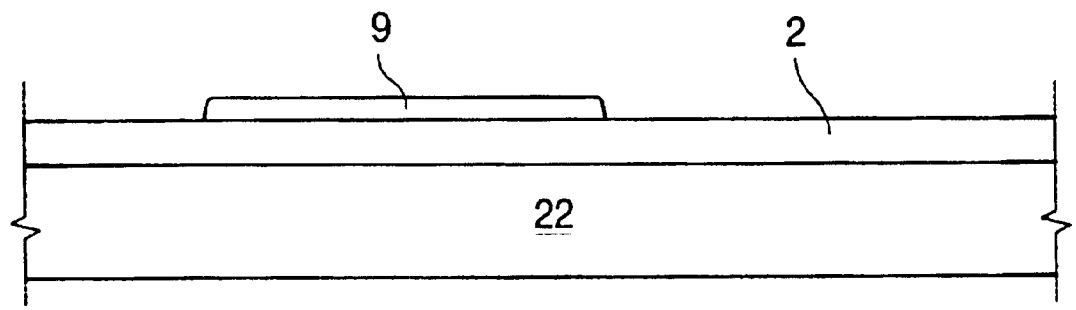
Figure 2C:
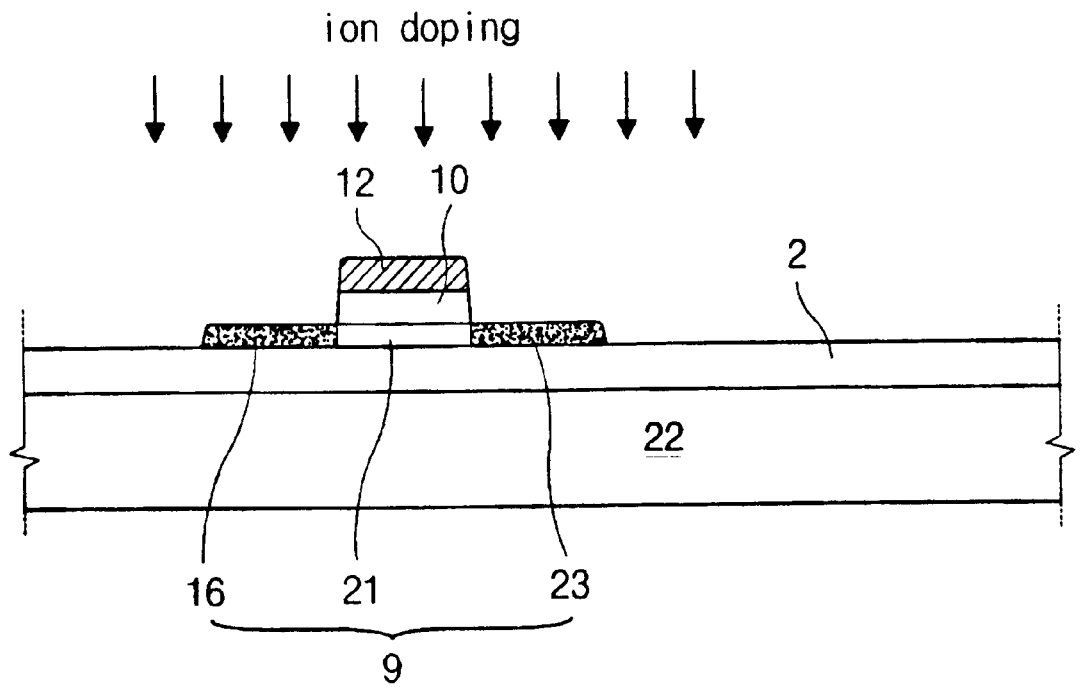
Figure 2D:
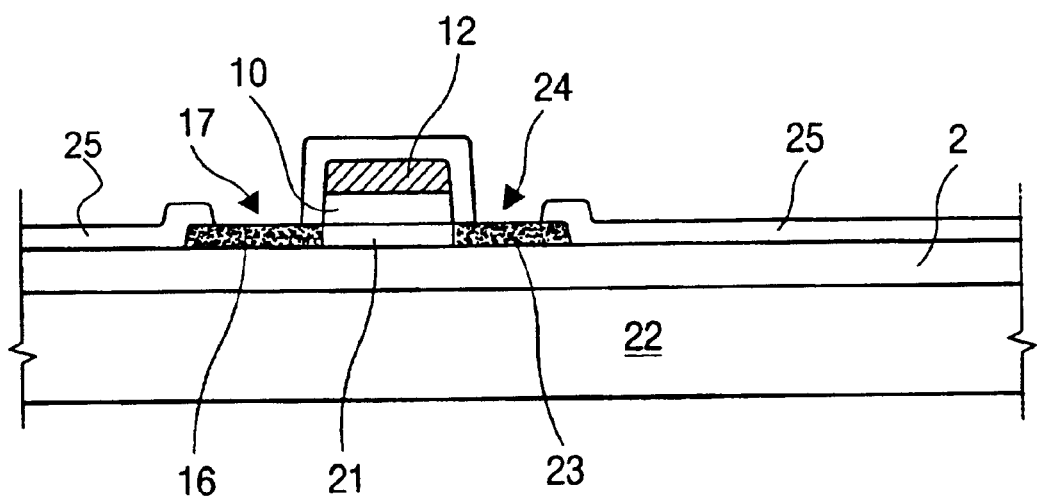
Figure 2E:
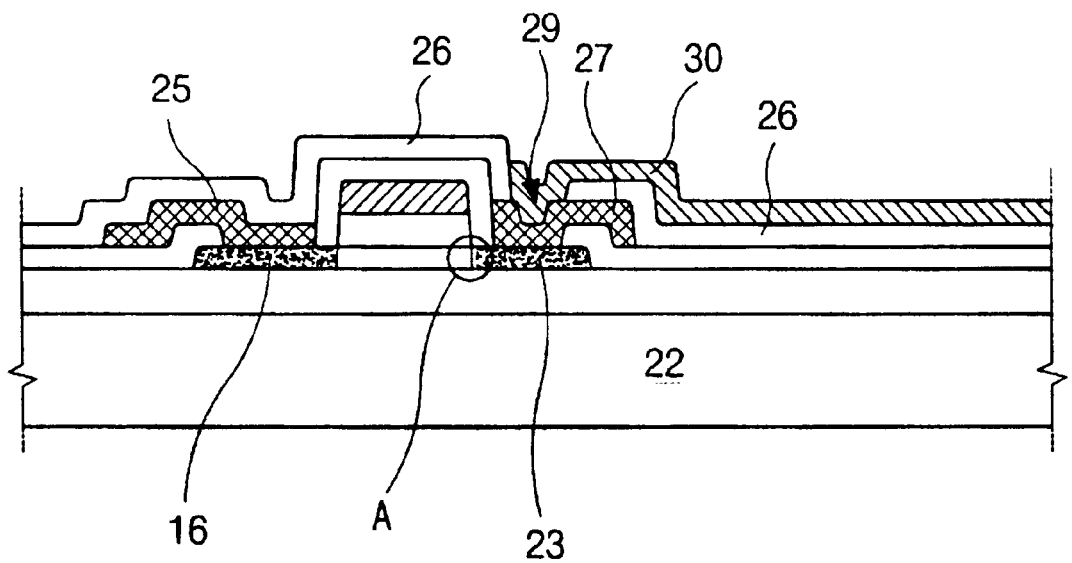
Figure 3A:
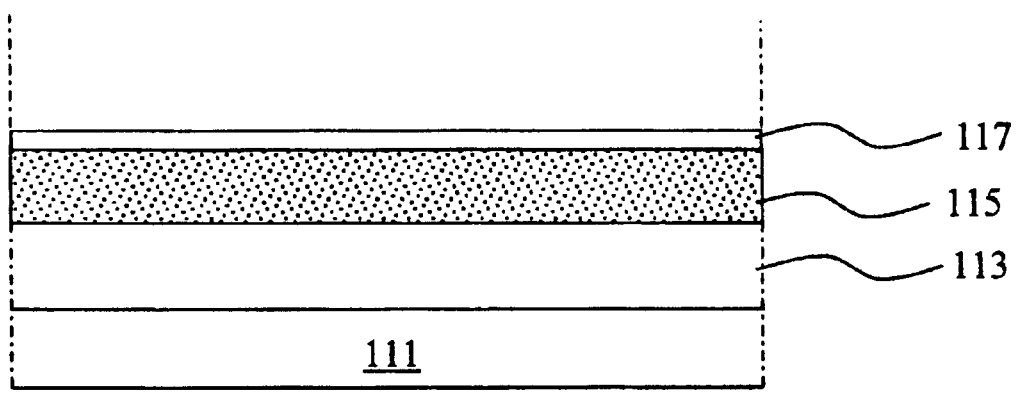
FIGS. 3A to 3G are cross-sectional view illustrating fabrication process of a polycrystalline silicon (poly-Si)/amorphous silicon (a-Si) double layer thin film transistor (TFT) according to the present invention.

Referring to FIG. 3A, a buffer layer 113 is formed on a substrate by depositing silicon nitride ($SiN_x$) or silicon oxide ($SiO_2$). The buffer layer 113 serves to prevent an alkali material from extracting from the substrate 111. Also, it should be considered that the buffer layer 113 has to have a good adhesion to a metal formed thereon in a later step. The thickness of the buffer layer 103 is beneficially 1 micrometer ($\mu$m).

Thereafter, a first amorphous silicon (a-Si) layer 115 is deposited on the buffer layer 113 by a thickness of 4000 angstroms (Å) using CVD (chemical vapor deposition) or LPCVD (low pressure chemical vapor deposition).

Then, an oxidized layer 117 is formed on the first amorphous silicon layer 115. The oxidization method on the amorphous silicon is very variable. For example, one is the method of putting the substrate having an amorphous silicon layer under an oxygen atmosphere in a chamber, and another is a method of dipping the substrate having an amorphous silicon layer into a solution that includes concentrated sulfuric acid and oxygenated water in a ratio of 4 to 1. At this time, the thickness of the oxidized layer 117 is between 10 to 20 angstroms (Å).

Figure 3B:
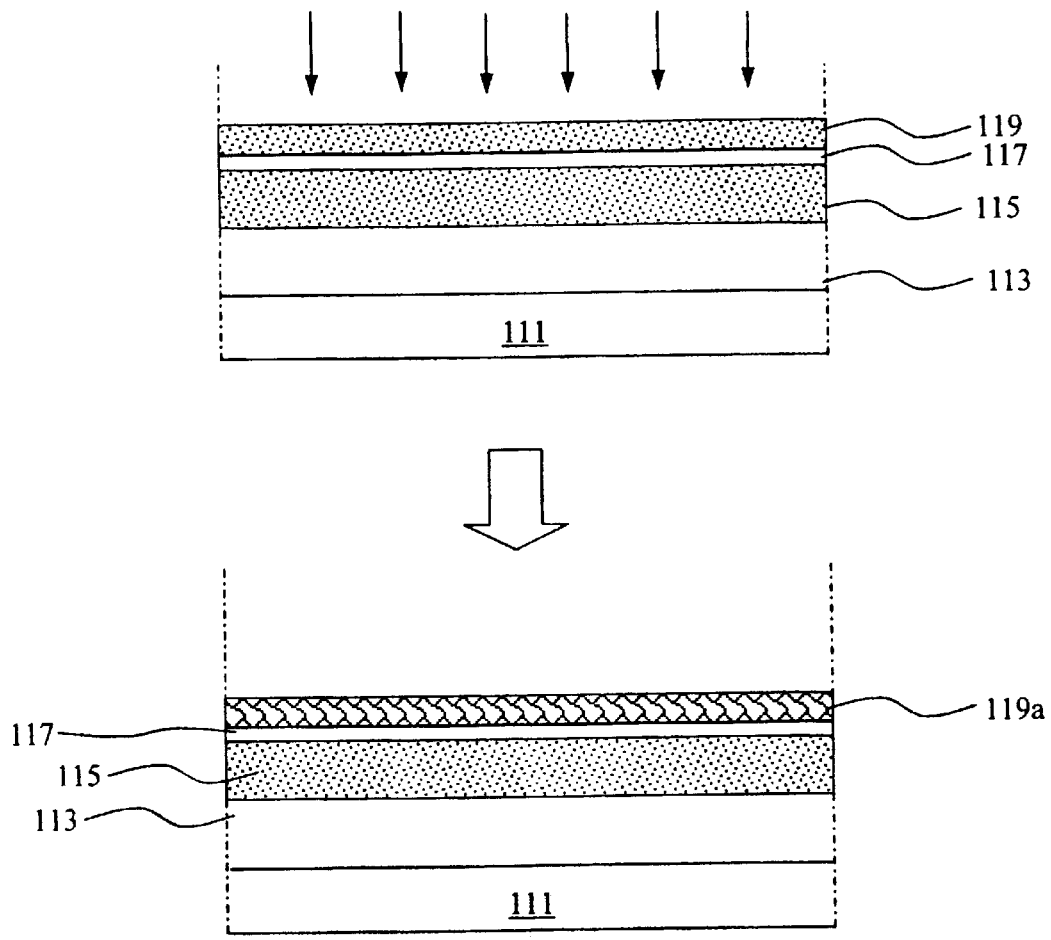

Referring to FIG. 3B, a second amorphous silicon layer 119 is formed on the oxidized layer 117 by a thickness of about 400 angstroms (Å). Thereafter, an excimer laser irradiates the second amorphous silicon layer 119 such that the amorphous silicon layer 119 is turned into a polycrystalline silicon (poly-Si) layer 119a. At this time, the excimer laser has an energy level of 230 mJ/cm$^2$. This energy level does not affect the first amorphous silicon layer 115 but only the second amorphous silicon layer 119, such that only the second amorphous silicon layer 119 is converted into the polycrystalline silicon layer 119a. Namely, the excimer laser ($E_{laser}$=230 mJ/cm$^2$) is irradiated on the upper surface of the second a-Si layer 119 and only the second a-Si layer 119 is crystallized into the poly-Si layer 119a because the oxidized layer 117 blocks the grain growth of silicon. The excimer laser energy of such a level can be absorbed into the second a-Si layer 119 by a thickness of less than 200 angstroms (Å). Thus, the grain grows only in the upper part of the second a-Si layer 119. However, the other lower part of the second a-Si layer 119 is crystallized by latent heat and conductive heat of the excimer layer. Accordingly, the grain growth proceeds to the oxidized layer 117 in all part of the second a-Si layer 119. The reason of the growth to the oxidized layer 117 is that the second a-Si layer 119 has a different lattice structure from the oxidized layer. As a result, the first a-Si layer 115, under the oxidized layer 117 remains uncrystallized.

Figure 3C:
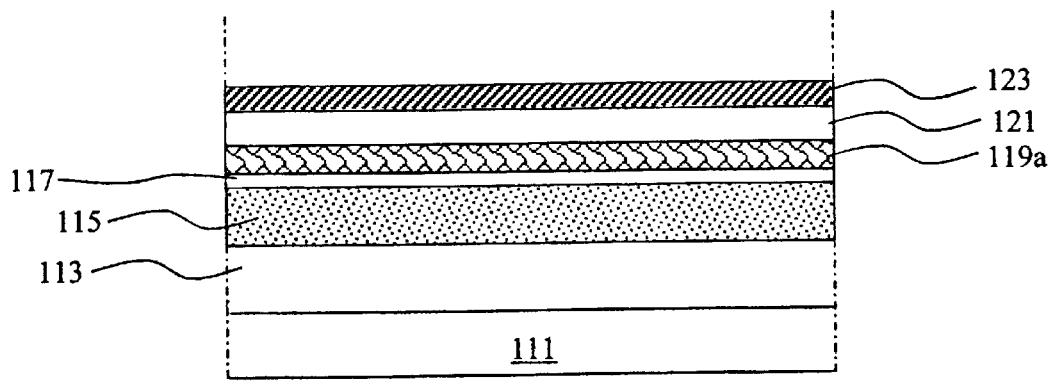

Now, referring to FIG. 3C, a gate insulating layer 121 having a thickness of 1000 angstroms (Å) is formed on the poly-Si layer 119a using PECVD (plasma-enhanced chemical vapor deposition). The gate insulating layer 121 is desirably formed by depositing TEOS (tetraethylorthosilicate: $Si(C_2H_5O)_4$) on the poly-Si layer 119a. The TEOS is excellent in step coverage property and also high in film forming rate. It is also strong enough to resist the breakdown voltage.

After that, a metal layer 123 is formed on the gate insulating layer 121 by depositing a metallic material selected from a group consisting of aluminum (Al), aluminum niobium (AlNb), chrome (Cr), tungsten (W), molybdenum (Mo) and the like.

Figure 3D:
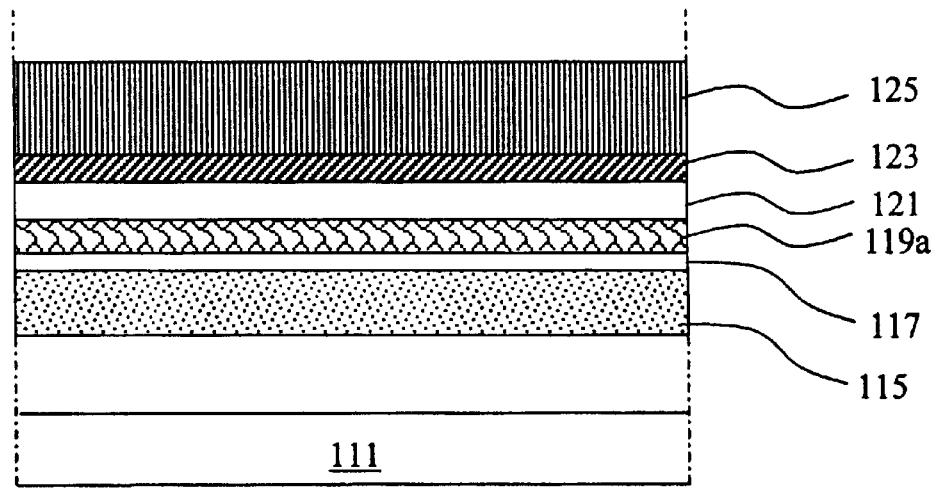
Figure 3D:
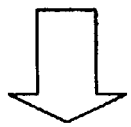
Figure 3D:
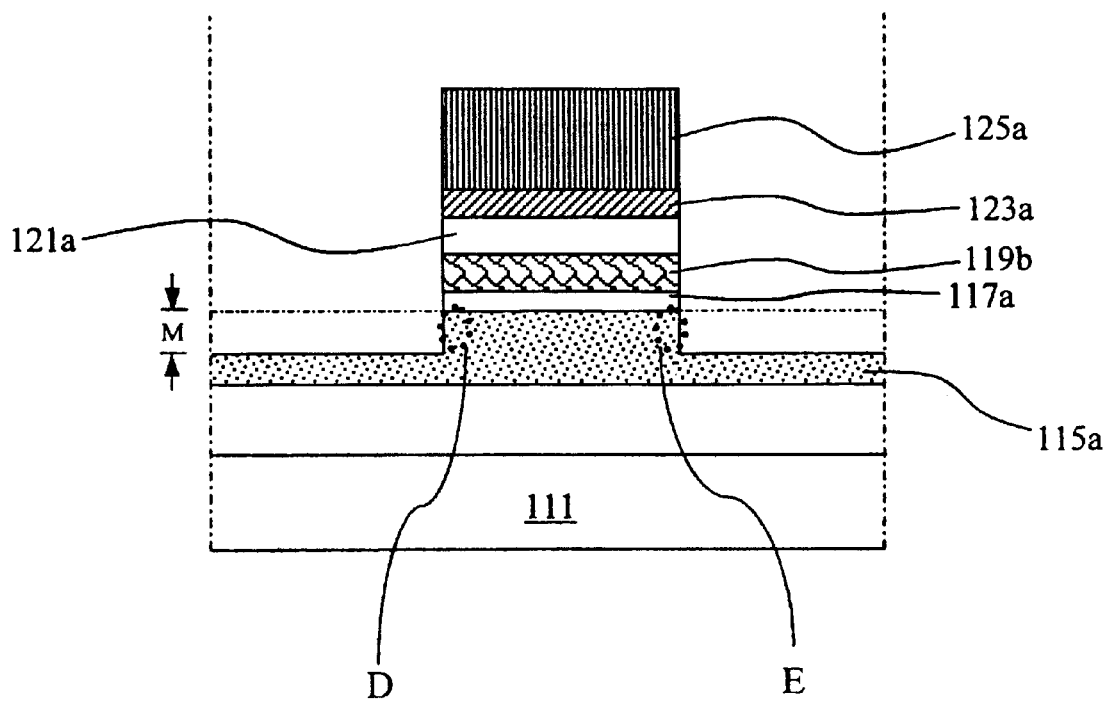

FIG. 3D shows a photo-lithography process to form a gate electrode, an active layer and vertical offsets. As shown, a photo-resist 125 is formed on the metal layer 123. Then, portions of the photo-resist 125 is exposed and patterned to form an island-shaped photo-resist 125a. Thereafter, the other layers (the metal layer 123, the gate insulating layer 121, the poly-Si layer 119a, the oxidized layer 117 and the first a-Si layer 115) are etched using the island-shaped photo-resist 125a as a mask. At this time, if the metal layer 123 is able to be etched by a dry etch method, the plasma dry etch method is used. Further, if the metal layer 123 is not able to be etched by the dry etch method, the metal layer 123 is etched using a wet etch method and then later the other layers (the gate insulating layer 121, the poly-Si layer 119a, the oxidized layer 117 and the first a-Si layer 115) are simultaneously etched using the dry etch method.

After the above-mentioned process, a gate electrode 123a and an active layer 119b are formed in an island shape. However, the first a-Si layer 115 is partially etched. Namely, portions of the first a-Si layer 115 on both sides of the island-shaped layers are etched by a thickness of 3000 angstroms (Å), i.e., M=3000 angstroms (Å). Thereafter, the vertical a-Si offsets "D" and "E" are formed by a thickness of 3000 angstroms (Å) between the poly-Si channel (i.e., the active layer 119b) and the source/drain electrode (that will be formed in a later step) without any additional photolithography process. The vertical a-Si offsets "D" and "E" respectively make a distance of about 2 micrometers ($\mu$m) between the poly-Si active channel layer 119b and the source/drain electrode (that will be formed in a later step).

Figure 3E:
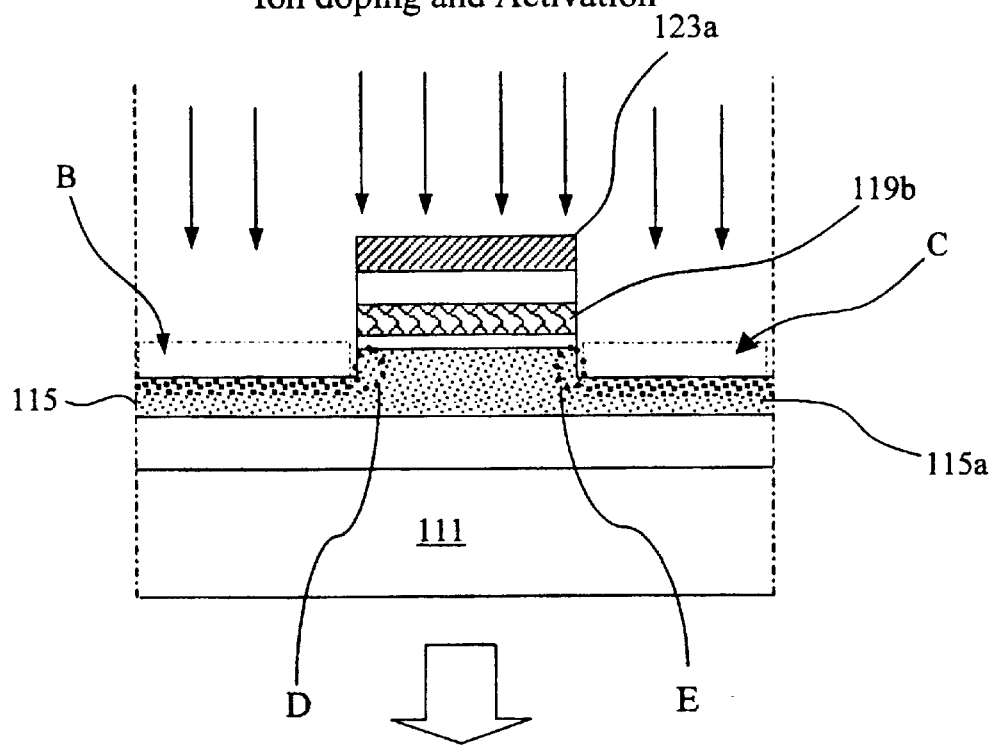
Figure 3E:
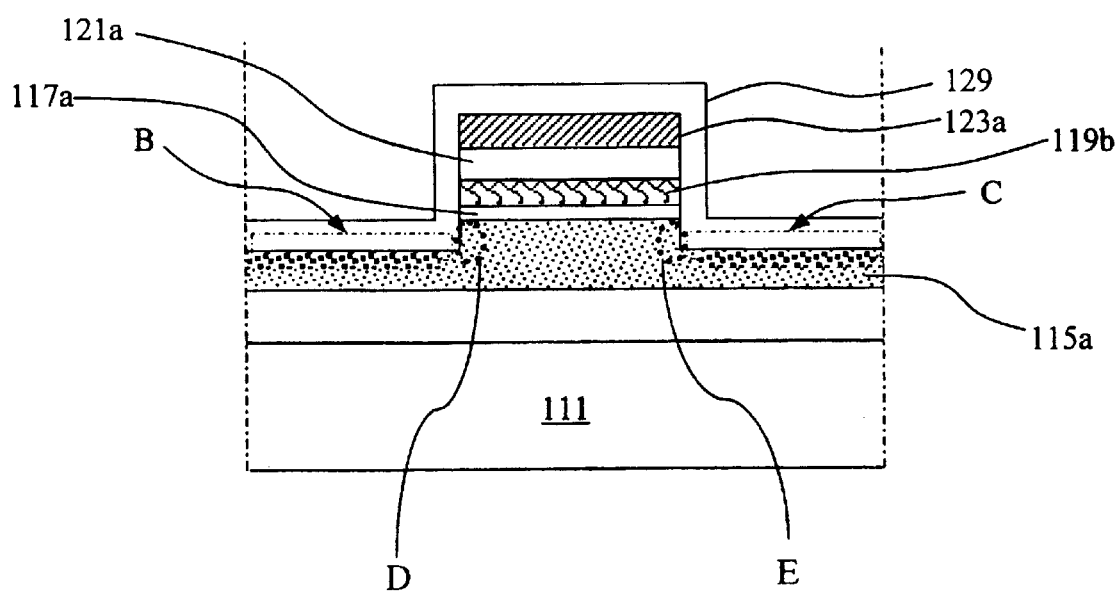

Now, referring to FIG. 3E, a source area "B" and a drain area "C" are formed on the surface of the etched a-Si layer 115a by doping the $p^+/n^+$ ions using the gate electrode 123a as an ion stopper. Although the gate electrode 123a is used as the ion stopper in FIG. 3E, the photo-resist 125a (in FIG. 3D) can be used as the ion stopper before it is removed from the gate electrode surface. As a material for the $n^+$ ions, phosphorous (P) is mainly used. When the $n^+$ ions are doped in the source/drain area "B"/"C" in the surface of the etched first a-Si layer 115a, these ions generate free electrons by way of combination with the silicon lattices. These free electrons drop the contact resistance between the active layer 119b and the later formed source/drain electrode.

The phosphorous ions permeate into the source and drain areas "B" and "C". These implanted ions are instable in the surface of the etched first a-Si layer 115a, so excimer laser activation is carried out. Thus, the implanted ions are diffused into the etched first a-Si layer 115a and then maintain their stability.

Furthermore, if the fabrication processes and structure mentioned before are used for the small-sized liquid crystal panel, the poly-Si can be employed for the source area "B" and drain area "C" and then this poly-Si can be substituted for the source/drain electrode. Further, the active layer can be substituted for the gate electrode if the ions are doped on the surface of the active layer. Accordingly, the metal gate electrode is not required in this structure.

Still referring to FIG. 3E, an interlayer insulator 129 is formed to cover the above-mentioned etched layers (the gate electrode 123a, the etched gate insulation layer 121a, the active layer 119b, the etched oxidized layer 117a and the etched first a-Si layer 115a).

Figure 3F:
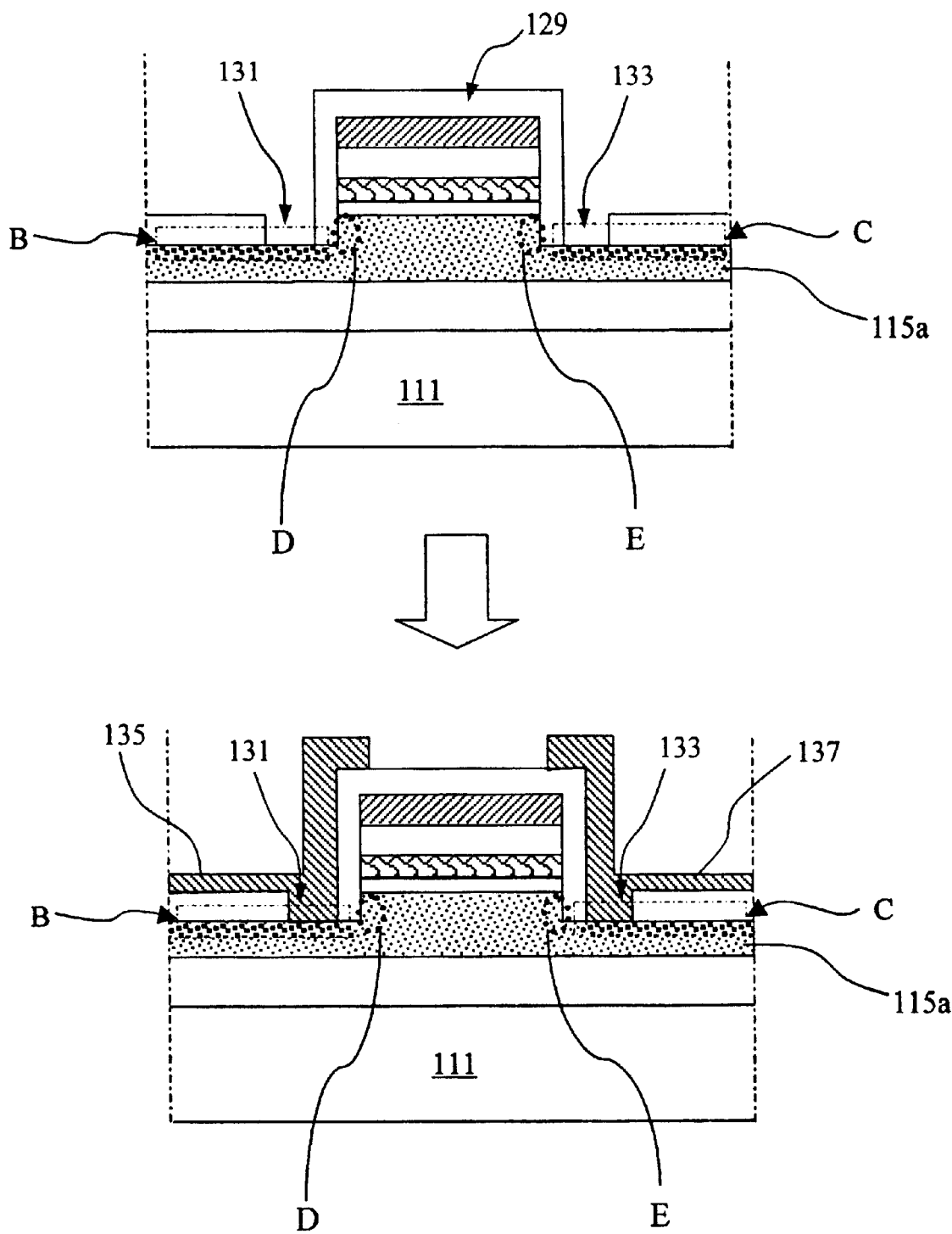

Now, referring to FIG. 3F, first and second contact holes 131 and 133 are formed by patterning the interlayer insulator 129. The first and second contact holes 131 and 133 respectively expose portions of the source area "B" and drain area "C" of the etched first a-Si layer 115a. After that, source and drain electrodes 135 and 137 are formed by depositing and patterning a metallic material. The source electrode 135 contacts the source area "B" through the first contact hole 131, while the drain electrode 137 contacts the drain area "C" through the second contact hole 133.

Figure 3G:
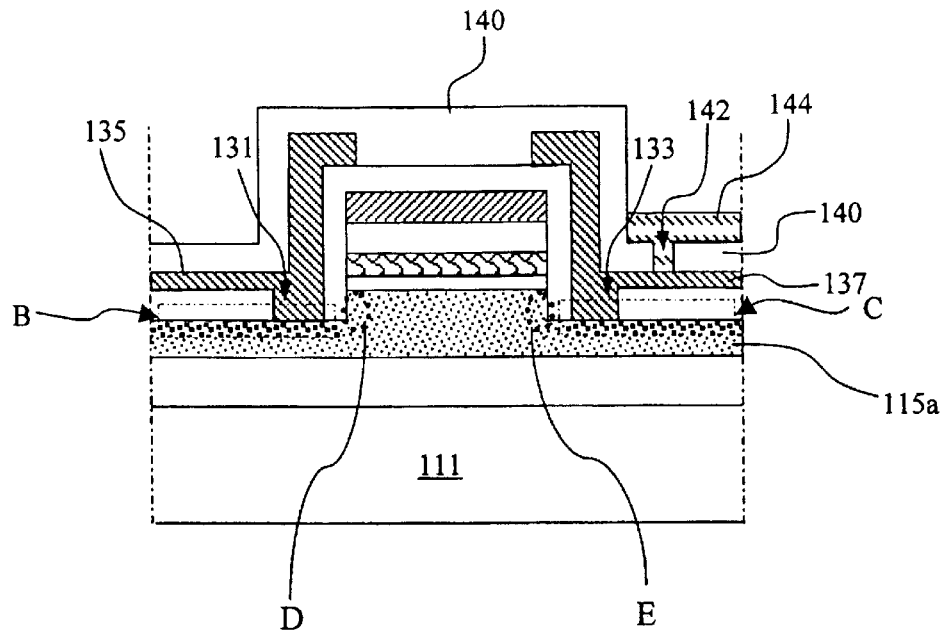

Referring to FIG. 3G, a passivation layer 140 is formed over the entire surface of the substrate 111. Then, a drain contact hole 142 to the drain electrode 133 is formed by patterning the passivation layer 140. Thus, the drain contact hole 142 exposes a portion of the drain electrode 133. Thereafter, a transparent conductive material is deposited on the passivation layer 140 and then patterned to form a pixel electrode 144 that contacts the drain electrode 133 through the drain contact hole 142. Accordingly, the poly-Si/a-Si double layer TFT is complete.

Figure 4:
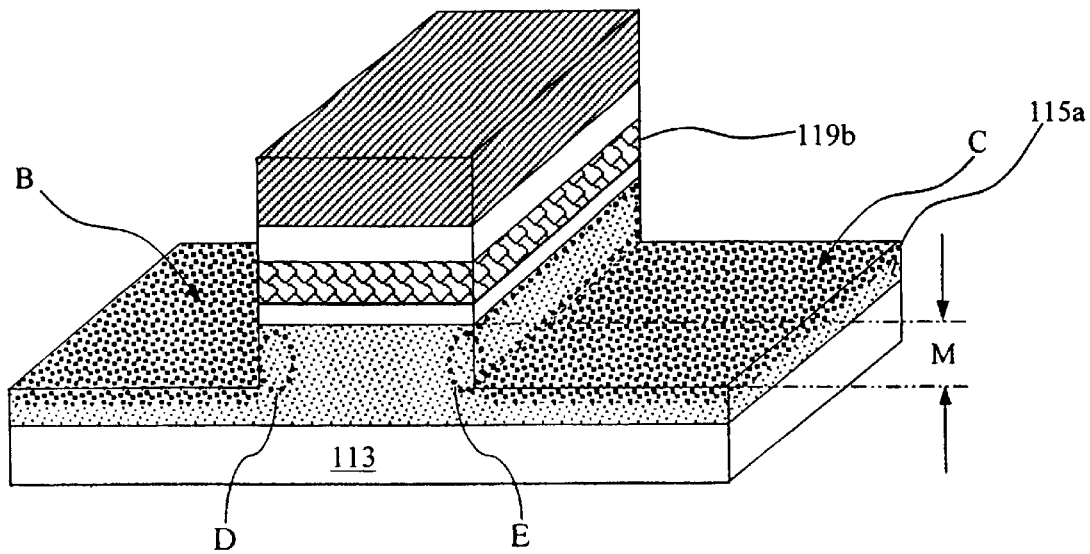
FIG. 4 is a perspective view illustrating the inventive poly-Si/a-Si double layer TFT with vertical a-Si offsets according to the present invention.

FIG. 4 is a perspective view illustrating the inventive poly-Si/a-Si double layer TFT with vertical a-Si offsets according to the present invention. As shown, the thin film transistor (TFT) has the poly-Si channel 119b (i.e., the active layer) and doped a-Si source/drain area "B"/"C" and the vertical offsets "D" and "E" having the thickness "M". The OFF current of TFT decreases much more because most of the electric field in the drain area "C" is applied to the highly resistive a-Si offset rather than the poly-Si active layer and the probability of the field enhanced electron-hole pair generation via trap states in a-Si is much less than that of poly-Si. Namely, if the poly-Si channel 119b keeps a distance from the source/drain area "B"/"C", the electric field between the active layer 119b (i.e., the poly-Si channel 119b) and the drain area "C" is inversely proportional to that distance between them. From this characteristic, if the a-Si offset "E" between the drain area "C" and the poly-Si channel 119b is formed, the electron-hole pair generation and leakage current decrease because the electric field is much less than that of the conventional art in the drain depletion region. Accordingly, the on/off current ratio increases by more than five times and the switching performance of the inventive TFT is considerably improved as compared with the conventional TFT.

Figure 5:
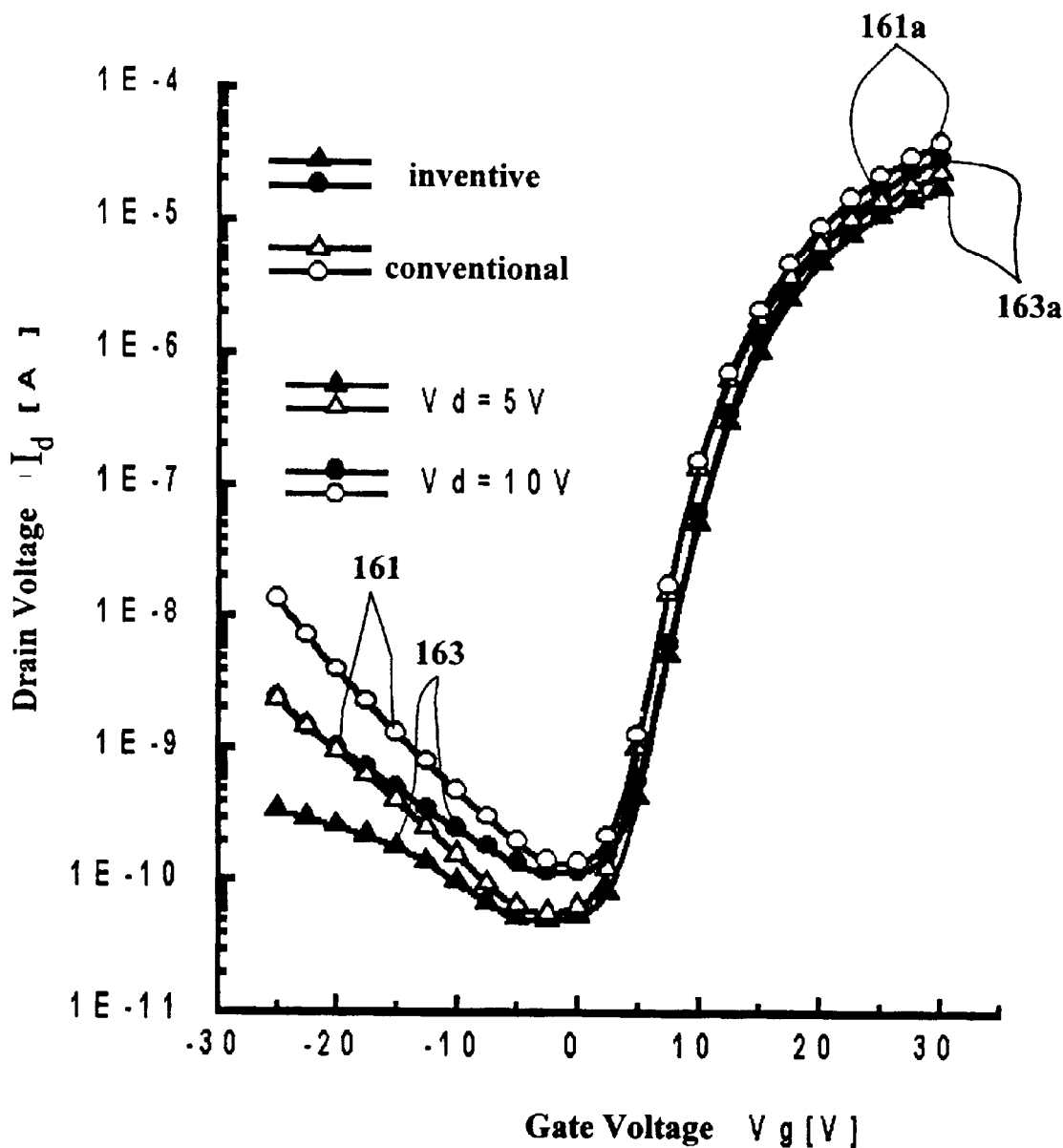
FIG. 5 is a graph showing the $I_D$–$V_D$ transfer characteristics of a conventional TFT and of the inventive offset TFT.

FIG. 5 is a graph showing the $I_D$–$V_D$ transfer characteristics of the conventional TFT and of the inventive offset TFT. While the gate voltage gradually increases from –30 V to +30 V at a fixed rate, the variation of the drain current flowing through the active channel layer is measured. Further, the drain voltage is 5 V and 10 V ($V_d$=5 V and $V_d$=10 V), while the transfer characteristics are measured.

As shown in FIG. 5, the OFF current 161 of the conventional TFT is much larger than the OFF current 163 of the inventive offset TFT. Namely, the leakage current of the inventive offset TFT decreases by about 89% compared to the conventional art, and the ON current 163a of the inventive offset TFT decreases by about 20% compared to the ON current 161a of the conventional TFT. Accordingly, the ON/OFF current ratio increases by more than five times.

Figure 6A:
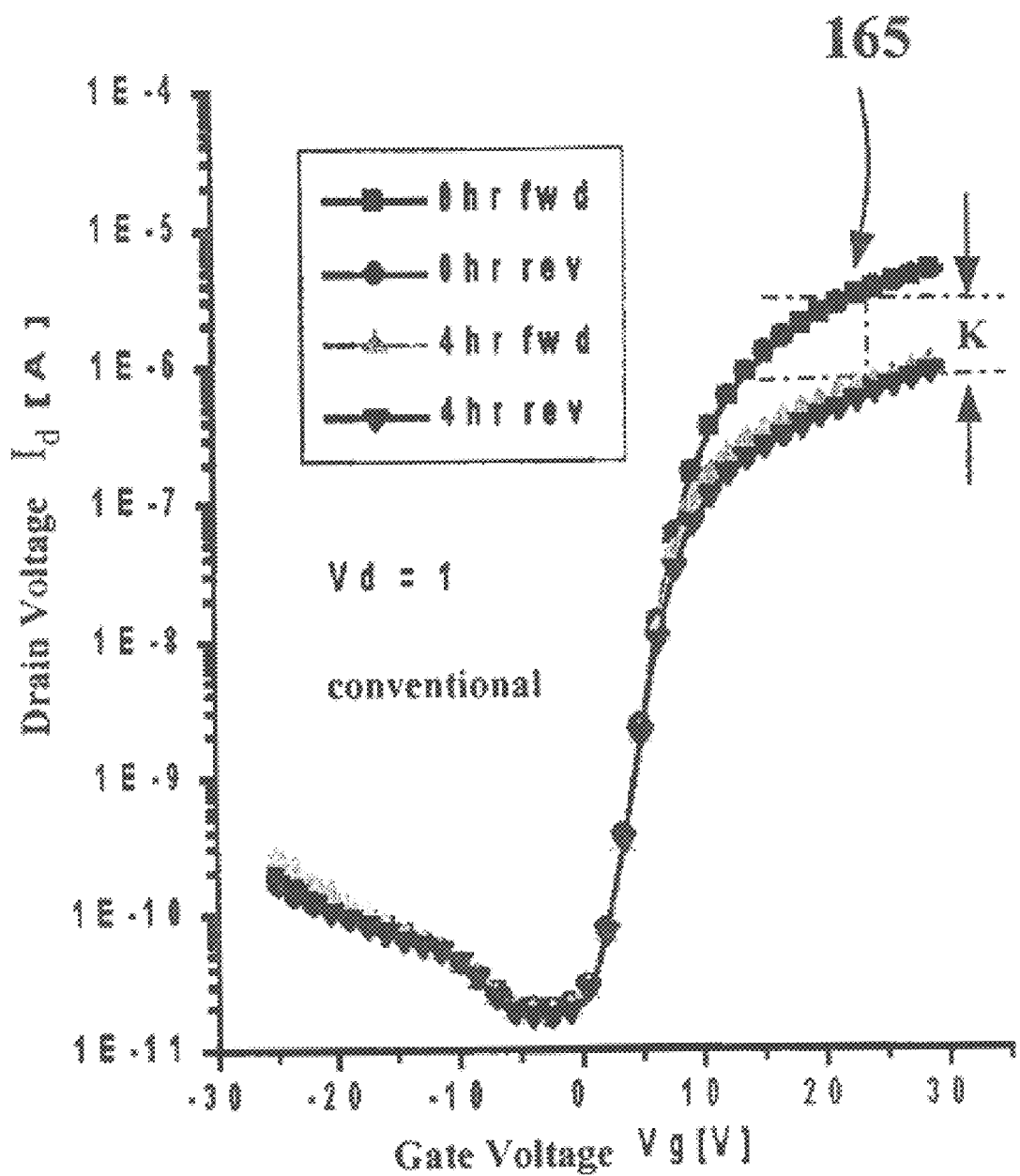
FIGS. 6A to 6C are graphs showing transfer characteristics comparisons between before and after electrical stress.
Figure 6A:
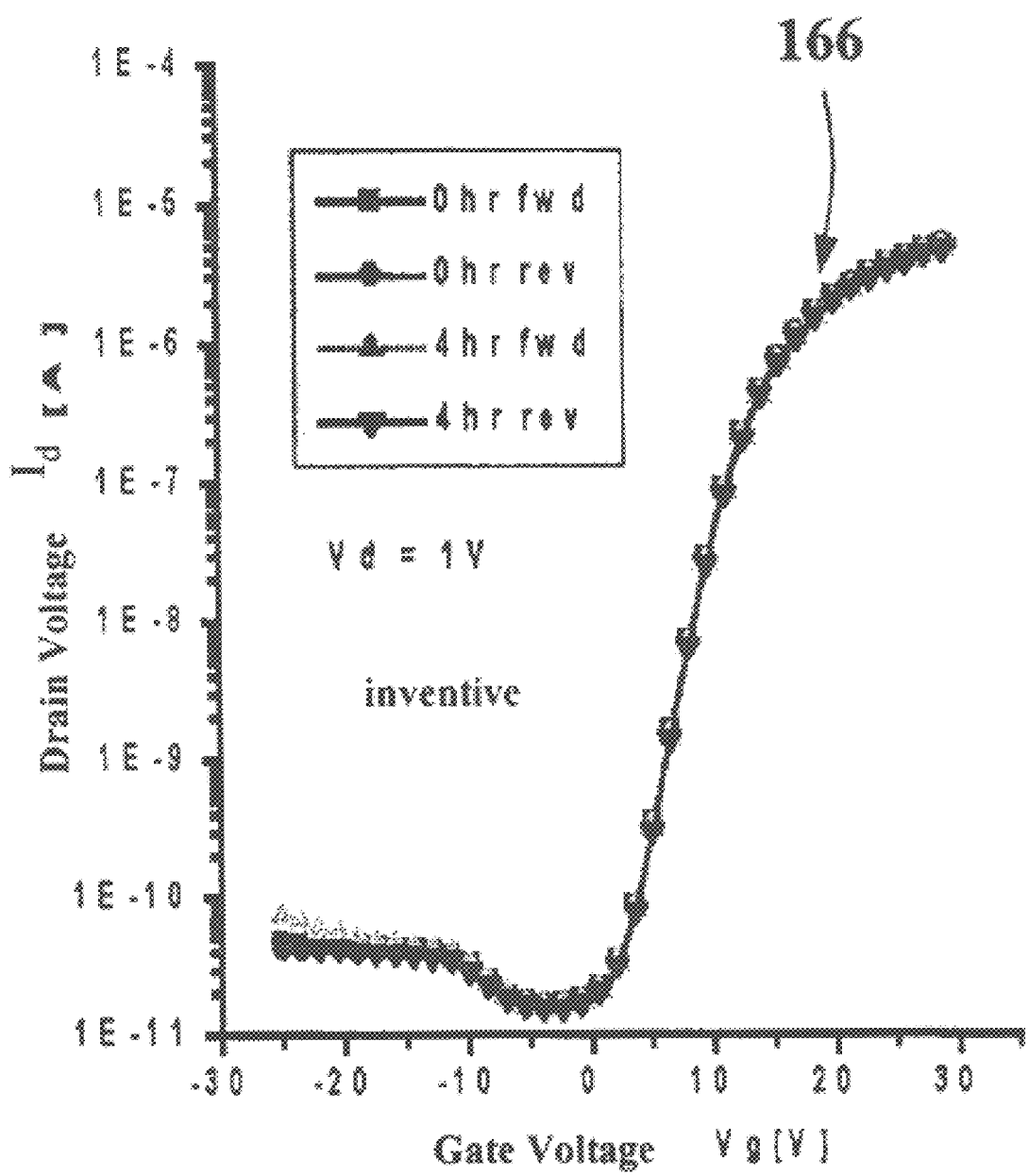
Figure 6B:
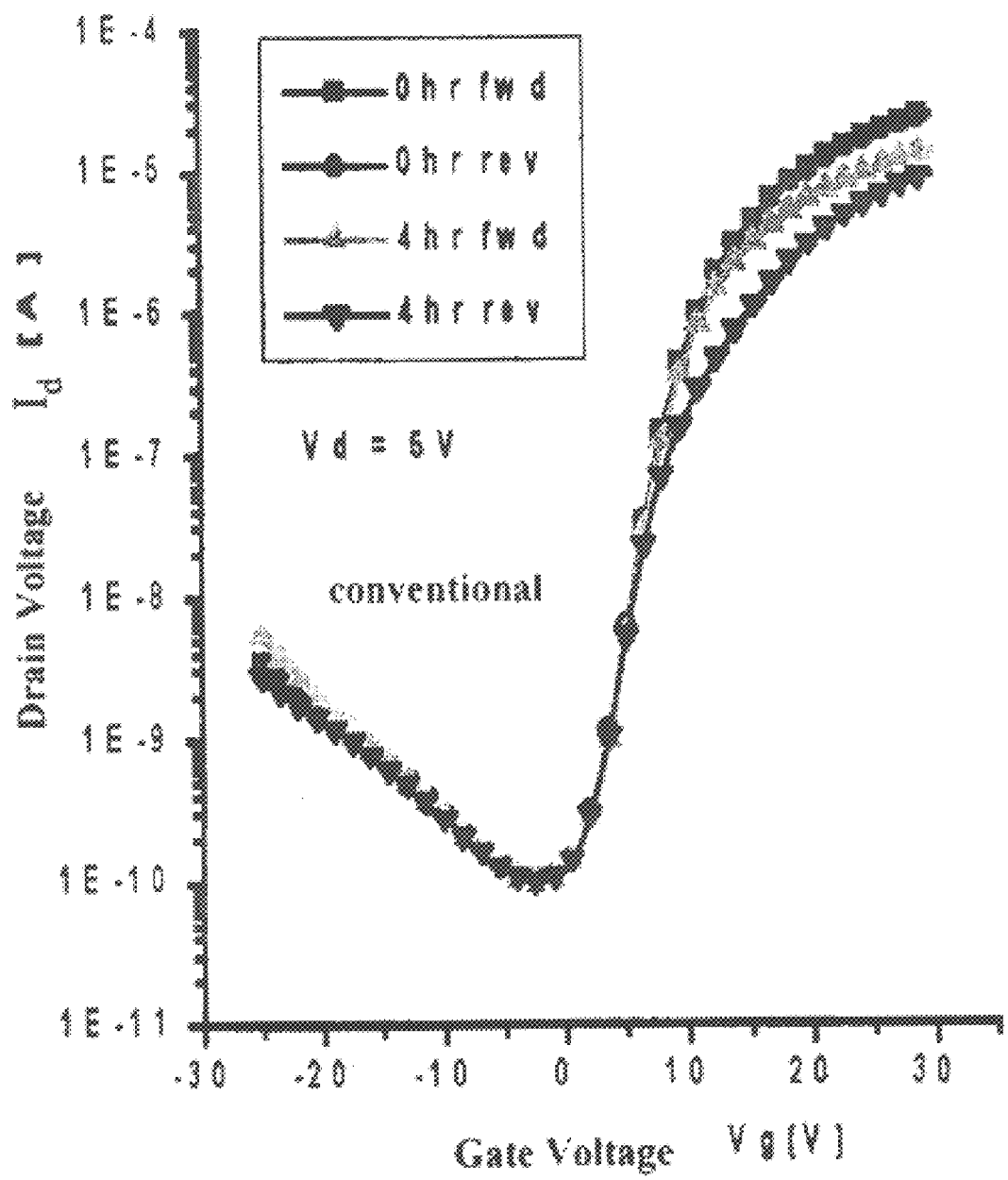
Figure 6B:
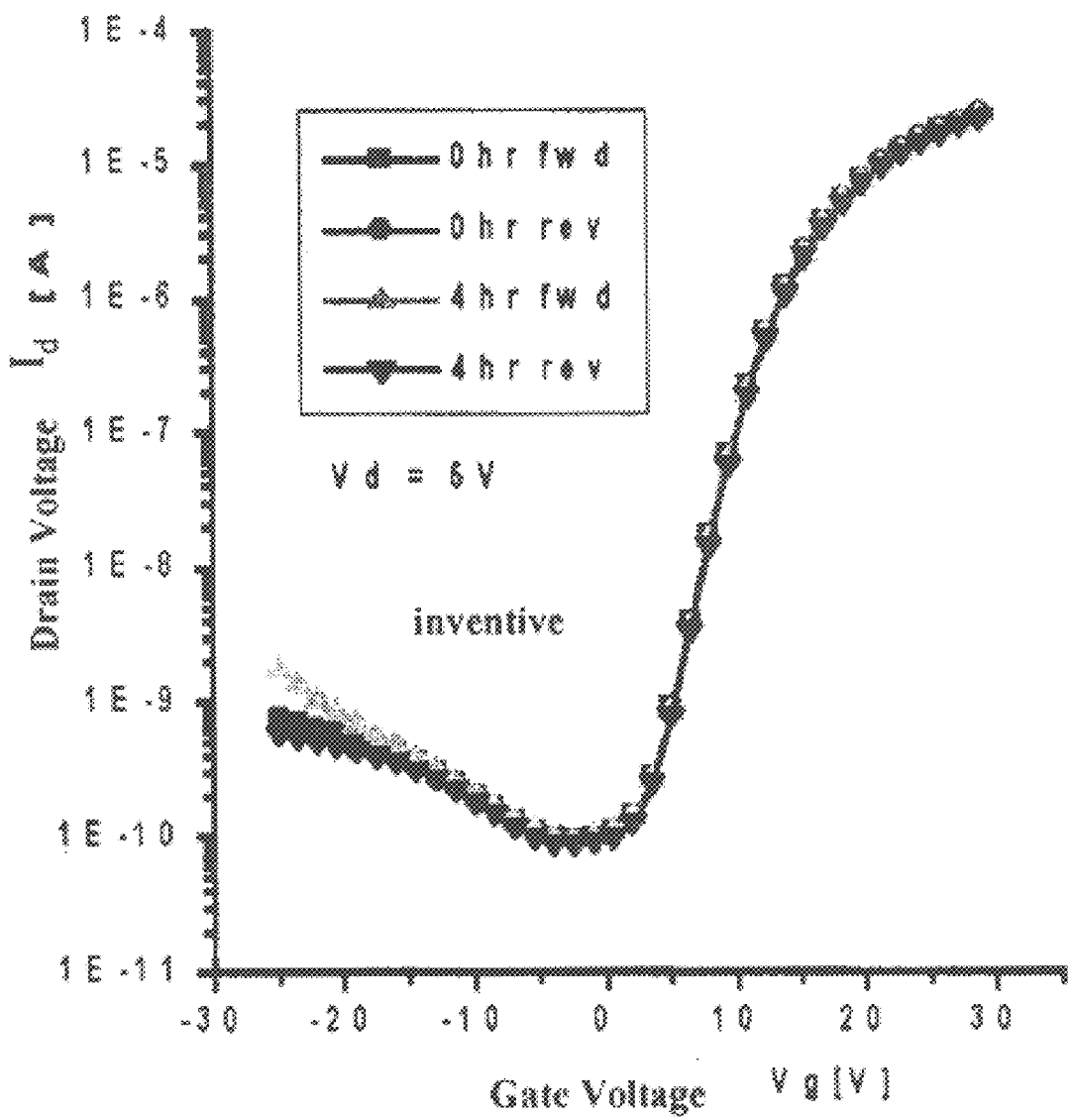
Figure 6C:
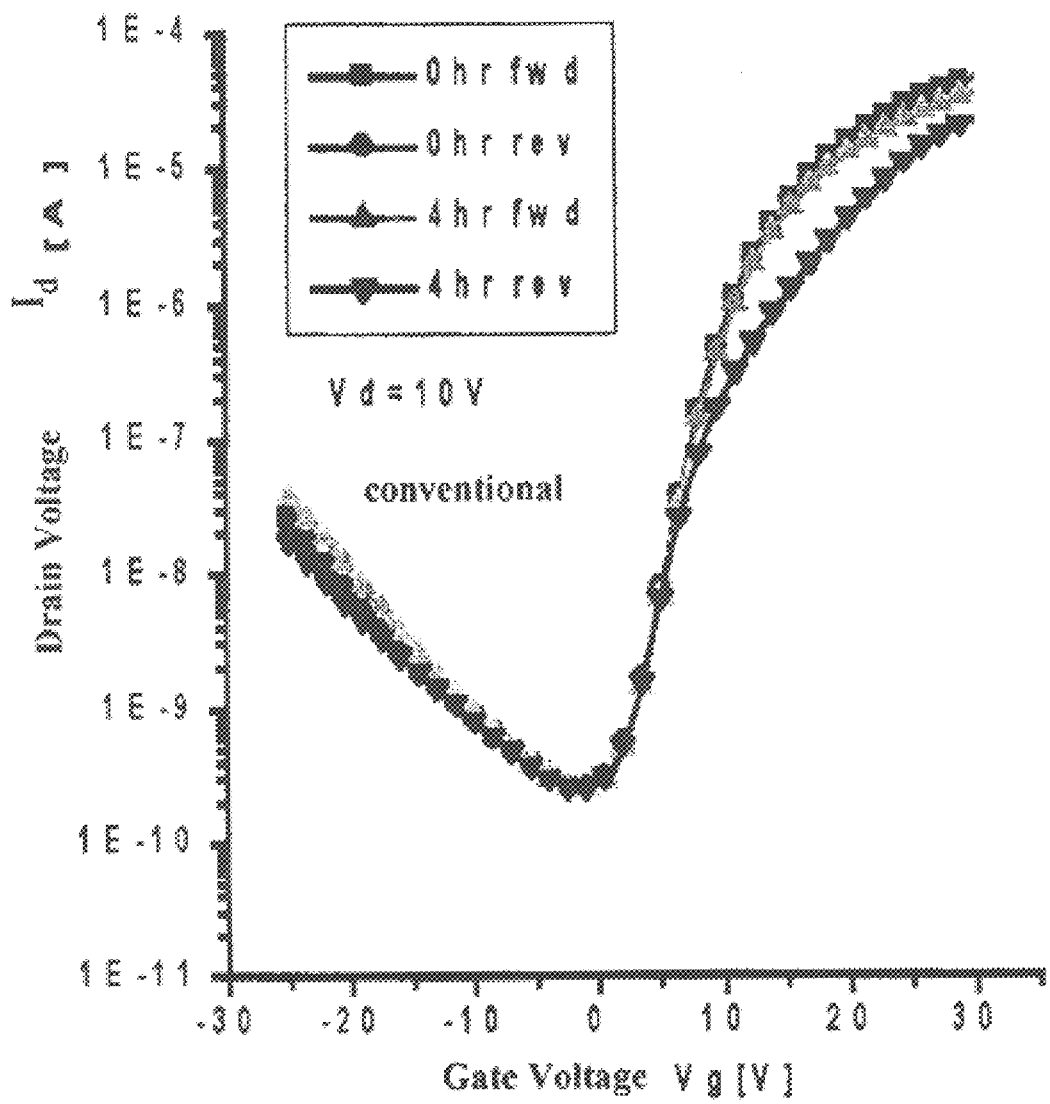
Figure 6C:
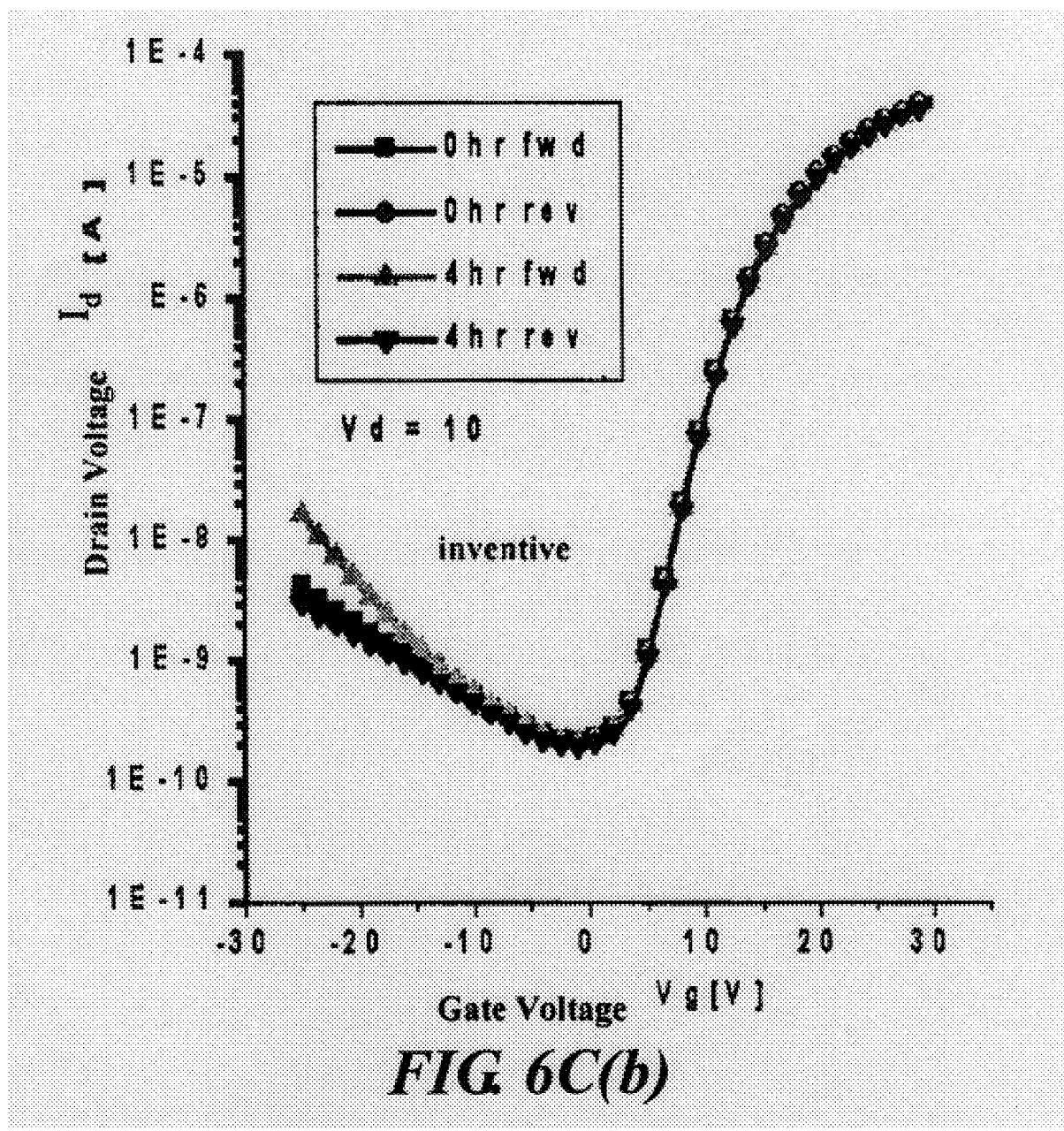

FIGS. 6A to 6C are graphs showing transfer characteristics comparisons between before and after electrical stress. The transfer characteristics change is investigated before and after 4 hours' bias stress, and during the electrical stress the gate electrode and drain electrode receive $V_g$ and $V_d$ that are fixed at 30 V. The electrical characteristics are measured in two different conditions, i.e., forward and reverse modes. In the forward mode "fwd", the measurement is carried out with the source and the drain electrodes fixed to be the same as during the electrical stress. In the reverse mode "rev", the source and the drain electrodes are changed. The drain voltages ($V_d$) are 1 V in FIG. 6A, 5 V in FIG. 6B and 10 V in FIG. 6C.

Referring to FIG. 6A, the graph (a) shows the transfer characteristics of a conventional TFT while the graph (b) shows that of the inventive offset TFT. The ON current 165 of the conventional TFT decreases as much as "K" regardless of whether in the forward mode or in the reverse mode. On the contrary, the ON current 166 of the inventive offset TFT hardly decreases.

In the same way as above-mentioned, when $V_d$ is 5 V and $V_d$ is 10 V, as shown in FIGS. 6B and 6C, the ON current and threshold voltage of the conventional TFT are degraded after 4 hours' bias stress. However, the degradation of the ON current and threshold voltage of the inventive offset TFT is negligibly small or does not occur.

From the results of FIGS. 6A to 6C, a noteworthy phenomenon appears in the degradation of the conventional TFT. The decrease of the ON current in a conventional TFT is larger when $V_d$ is 1 V than when $V_d$ is 5 V or 10 V. Further for large $V_d$, the forward and the reverse characteristics exhibit severe asymmetry because the additional trap states are mainly formed near the drain junction rather than uniformly distributed over the whole channel. The additional trap states between the source and the channel in the reverse mode decreases the current flow because the trap states obstruct the carrier emission over the potential barrier from the source area to the channel region. However, in the forward mode, the additional trap states have very little effect on the current flow because most of the large $V_d$ is applied along the current flow in the drain depletion region. So that the free carriers obtain enough energy from the large $V_d$ to overcome the increased channel resistivity.

Figure 7A:
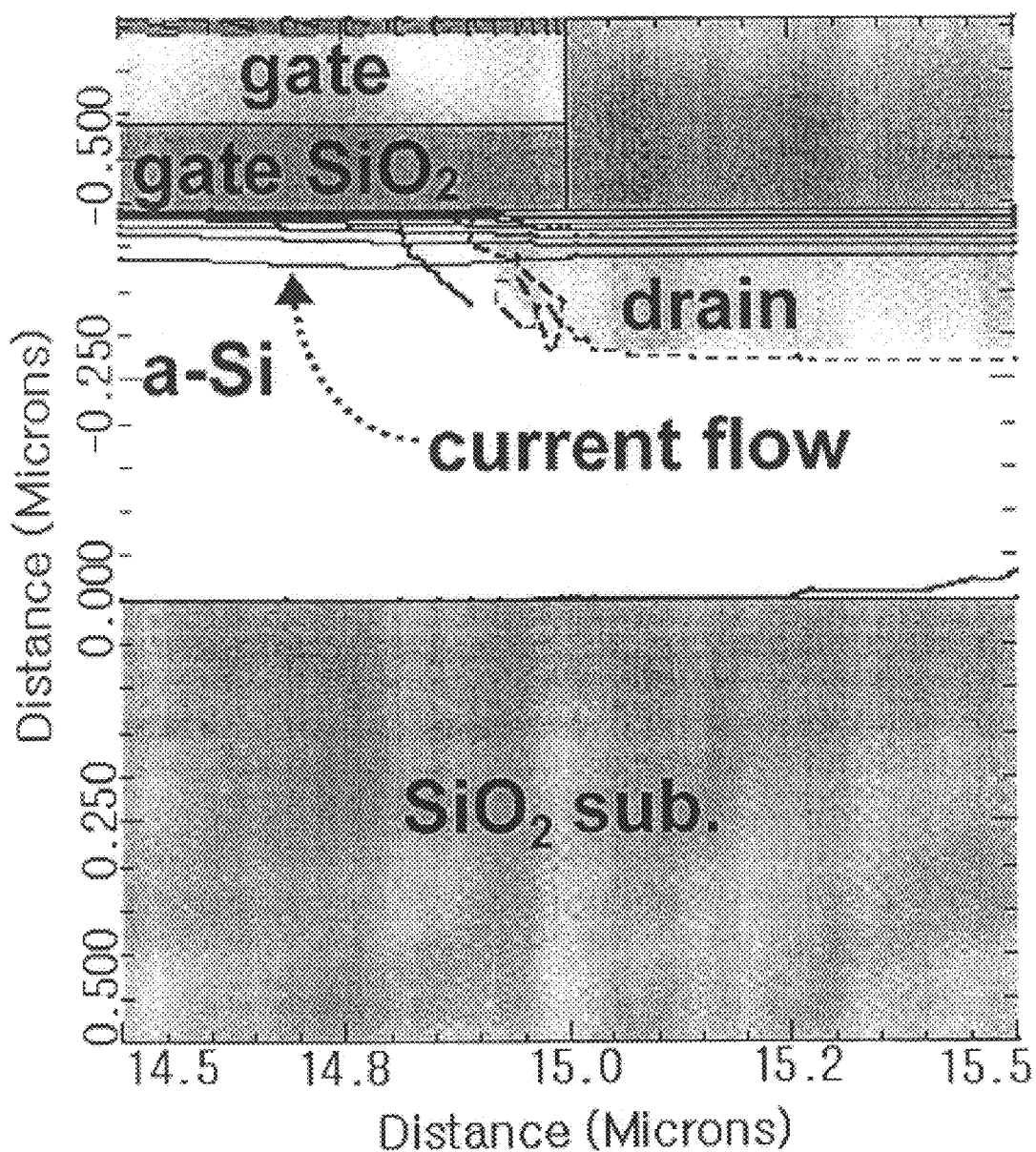
FIGS. 7A to 7B are partial cross-sectional views showing current flow line simulation in ON state of TFT.
Figure 7B:
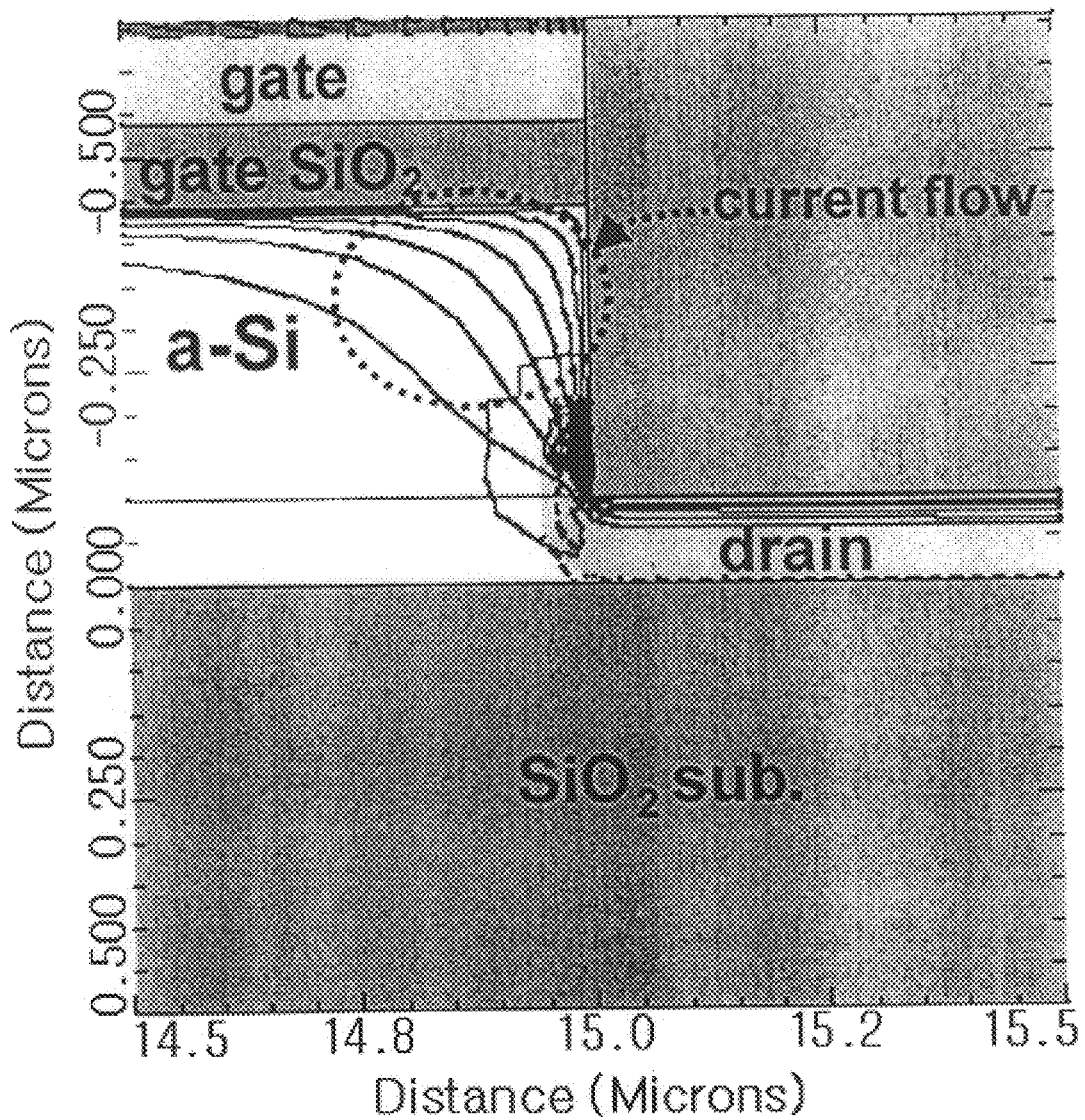

FIGS. 7A to 7B are partial cross-sectional views showing current flow line simulation in the ON state of a conventional TFT and of the inventive offset TFT, respectively. The gate voltage ($V_g$) and the drain voltage ($V_d$) are 10 V (i.e., $V_g = V_d = 10$ V).

Referring to FIG. 7A, the current flow in the drain depletion region of the conventional TFT focuses on the gate insulating layer (gate $SiO_2$).

Now from the simulation results in FIG. 7B, it can be verified that the current flows spreading down near the drain area. FIG. 7B shows enough evidence of the current spreading effect in the poly-Si/a-Si double layer structure. Accordingly, the current density is considerably reduced in the inventive offset TFT. Further, due to the low current density, the trap state generation is reduced in the poly-Si, thereby improving the electrical characteristics.

Accordingly, by employing the poly-Si/a-Si double layer, the inventive TFT has a very broad current path near the drain area where a large electric field is applied and the stability of the TFT has been improved due to the effective suppression of additional trap state generation by reducing the current density. The a-Si offsets in the inventive TFT are also effective for suppressing the off current when a large gate bias is applied by reducing the peak electric field, so that the maximum ON/OFF current ratio increases by five times.

Furthermore, the improved display quality of the large-sized liquid crystal panel is obtained by employing the inventive offset TFT. Since the degradation caused by the electrical stress is suppressed when driving the TFT for a long time operation, the stable operating characteristics are achieved.

Although preferred embodiments and advantages of the invention has been described, variations and changes thereof will be apparent to the skilled in the art. Therefore, the preferred embodiments are not given with the intention to restrict the present invention, the spirit and scope of which will be defined by the following claims.

What is claimed is:

1. A method of fabricating a thin film transistor ("TFT") for a liquid crystal display device, comprising:
    forming a buffer layer on a substrate;
    forming a first amorphous silicon layer on the buffer layer;
    forming an oxidized layer on the amorphous silicon layer;
    forming a second amorphous silicon layer on the oxidized layer;
    crystallizing the second amorphous silicon layer to form a polycrystalline silicon layer;
    forming a gate insulating layer on the polycrystalline silicon layer;
    forming a gate electrode on the gate insulating layer;
    patterning the gate electrode, gate insulating layer, polycrystalline silicon layer, and oxidized layer so as to expose the first amorphous silicon layer;
    forming source and drain areas by doping a dopant into the exposed first amorphous silicon layer using the gate electrode as an ion stopper;
    forming an interlayer insulator having first and second contact holes, the interlayer insulator covering the amorphous silicon layer, the oxidized layer, the polycrystalline silicon layer, the gate insulating layer, and the gate electrode; and
    forming source and drain electrodes contacting the source areas through the first contact hole and the drain area through the second contact hole, respectively.

2. The method according to claim 1, wherein the first amorphous silicon layer has a thickness of 3800–4200 angstroms (Å).

3. The method according to claim 1, wherein the oxidized layer has a thickness of 10–20 angstroms (Å).

4. The method according to claim 1, wherein forming the oxidized layer comprises dipping the substrate and the amorphous silicon layer into a solution that includes concentrated sulfuric acid and oxygenated water.

5. The method according to claim 1, wherein the dopant is $n^+$ ions.

6. The method according to claim 1, wherein the dopant in $p^+$ ions.

7. The method according to claim 1, wherein the polycrystalline silicon layer has a thickness of 350–450 angstroms (Å).

8. The method according to claim 1, wherein said step of crystallizing the second amorphous silicon layer comprises irradiating a surface of the second amorphous silicon layer with an excimer laser.

9. The method according to claim 8, wherein the excimer laser has an energy level in a range of 220–270 $mJ/cm^2$.

10. The method according to claim 1, wherein said step of forming the gate electrode includes forming the gate electrode in an island shape.

11. The method according to claim 1, wherein said step of forming the gate electrode, gate insulating layer, polycrystalline silicon layer, and oxidized layer comprises,
    forming vertical offsets by partially etching portions of the first amorphous silicon layer on opposing sides of the gate electrode, gate insulating layer, polycrystalline layer and oxidized layer.

12. The method according to claim 11, wherein in said step of partially etching approximately 3000 angstroms (Å) of the first amorphous silicon layer are etched for forming the vertical offsets.

* * * * *